(12) United States Patent
Roshanski (10) Patent No.: US 12,081,240 B2
(45) Date of Patent: Sep. 3, 2024

(54) STREAMING MEDIA COMMUNICATION WITH FORWARD ERROR CORRECTION

(71) Applicant: MARIS—TECH LTD, Ness Ziona (IL)

(72) Inventor: Magenya Roshanski, Hod Hasharon (IL)

(73) Assignee: MARIS—TECH LTD, Ness Ziona (IL)

( * ) Notice: Subject to any disclaimer, the term of this patent is extended or adjusted under 35 U.S.C. 154(b) by 0 days.

(21) Appl. No.: 18/286,009

(22) PCT Filed: Apr. 13, 2022

(86) PCT No.: PCT/IL2022/050386
§ 371 (c)(1),
(2) Date: Oct. 6, 2023

(87) PCT Pub. No.: WO2022/224243
PCT Pub. Date: Oct. 27, 2022

(65) Prior Publication Data
US 2024/0267060 A1 Aug. 8, 2024

(30) Foreign Application Priority Data

Apr. 20, 2021 (IL) .......................................... 282469

(51) Int. Cl.
*H03M 13/35* (2006.01)
*H04L 1/00* (2006.01)
(Continued)

(52) U.S. Cl.
CPC .......... *H03M 13/35* (2013.01); *H04L 1/0086* (2013.01); *H03M 13/27* (2013.01);
(Continued)

(58) Field of Classification Search
CPC ............................ H03M 13/35; H04L 1/0086
See application file for complete search history.

(56) References Cited

U.S. PATENT DOCUMENTS 5,974,580 A * 10/1999 Zook .................. G11B 20/1833
714/755
10,063,261 B1 8/2018 Croxall, II et al.
(Continued)

FOREIGN PATENT DOCUMENTS

EP 2058968 A1 5/2009
EP 2122887 A2 11/2009
(Continued)

OTHER PUBLICATIONS

Aug. 17, 2023 International Preliminary Report on Patentability issued on International Application No. PCT/IL2022/050386.
(Continued)

*Primary Examiner* — Joseph D Torres
(74) *Attorney, Agent, or Firm* — Whitestone Law, PLLC (57) ABSTRACT

A method and apparatus for transmitting a streaming media with Forward Error Correction (FEC). Upon receiving the streaming media, the technique includes: encoding, segmenting and packeting frames comprised therein to generate a packetized elementary stream of media packets with variable sizes; for each L sequential media packets, calculating a "random loss" (RL) FEC parity and generating a respective RL FEC packet associated therewith; calculating "burst loss" (BL) FEC parities in accordance with a predefined FEC scheme and generating respective BL FEC structures bearing FEC headers and usable for generating BL FEC packets; calculating size-related parameters of a group of sequential media packets, the group being selected in accordance with the FEC scheme; and, transmitting the packetized elementary stream with interleaved FEC packets. The BL FEC packets are transmitted merely when the calculated size-related parameters meet a size-related burst loss (SRB) criterion defined by the FEC scheme.

19 Claims, 8 Drawing Sheets

(51) Int. Cl.
  *H03M 13/00* (2006.01)
  *H03M 13/27* (2006.01)
  *H04L 65/75* (2022.01)

(52) U.S. Cl.
  CPC ...... *H03M 13/353* (2013.01); *H03M 13/6547* (2013.01); *H04L 65/762* (2022.05)

(56) References Cited

U.S. PATENT DOCUMENTS

| | | | |
|---|---|---|---|
| 2004/0128609 A1* | 7/2004 | Kurobe | H04L 1/0083 714/776 |
| 2006/0218459 A1 | 9/2006 | Hedberg | |
| 2007/0268972 A1* | 11/2007 | Kim | H03M 13/6362 375/E7.279 |
| 2007/0270103 A1* | 11/2007 | Kim | H04L 1/1819 455/69 |
| 2009/0193314 A1 | 7/2009 | Melliar-Smith et al. | |
| 2009/0210773 A1 | 8/2009 | Fang | |
| 2009/0276686 A1 | 11/2009 | Liu et al. | |
| 2016/0127077 A1* | 5/2016 | Bright-Thomas | H04L 65/00 714/776 |

FOREIGN PATENT DOCUMENTS

| | | |
|---|---|---|
| EP | 1262026 B1 | 2/2010 |
| EP | 3029869 A1 | 6/2016 |
| EP | 3425806 A1 | 1/2019 |

OTHER PUBLICATIONS

Jul. 19, 2022 Notification of Transmittal of the International Search Report and Written Opinion of the International Searching Authority issued on International Application No. PCT/IL2022/050386.

* cited by examiner

STREAMING MEDIA COMMUNICATION WITH FORWARD ERROR CORRECTION

TECHNICAL FIELD

The presently disclosed subject matter relates to techniques of reliable delivery of streaming media and, more particularly, to streaming media transmission with forward error correction (FEC).

BACKGROUND

Modern communication networks allow transferring large volumes of digital media between multiple end points. However, even with the advances in the capacity and reliability of the communication links, they can experience packet losses that are not acceptable for many networked applications including streaming transmission of video, audio, data and combinations thereof. The protocols that deal with these losses represent a trade-off between latency and reliability. Given that packet loss is unavoidable if there is a latency constraint, it is important to enable an acceptable level of packet loss.

Packet loss can occur in a random manner characterizing occasional losses of isolated packets or in a burst manner characterizing loss of several consecutive packets. The burstiness of packet loss is characterized by a burst length parameter, which measures the average length of consecutive packet loss.

Forward Error Correction (FEC) is a technology that is well known for its ability to reconstruct missing packets after random and/or burst losses whilst avoiding delays that come with multiple round-trip retransmissions. As FEC does not require handshaking between the source and the destination, it can be used for broadcasting of data to many destinations simultaneously from a single source.

Problems of implementing Forward Error Correction Techniques have been recognized in the conventional art and various techniques have been developed to provide solutions, for example:

US Patent Application No. 2009/0193314 discloses a forward error correction (FEC) algorithm that addresses both random and burst packet loss and errors. The transmitter calculates parity packets for the rows, columns and diagonals of a block of multi-media data packets using the exclusive or (XOR) operation and communicates the parity packets along with the multi-media data packets to the receiver. The receiver uses the parity packets to recover missing multi-media data packets in the block. The FEC algorithm is designed to be able to recover long bursts of consecutive missing data packets. If some parity packets are missing, they too can be recovered using an extra single parity packet, so that they can be used to recover other missing data packets.

US Patent Application No. 2009/0210773 discloses a technique of reliable file delivery using a combination of packet-level FEC on source data packets which are arranged in matrices, where encoding is performed on both rows and columns or on rows, columns and diagonals.

US Patent Application No. 2009/0276686 discloses a technique for protecting real time media including receiving media packets, generating media bit strings from the media packets, applying a forward error correcting code across the generated media bit strings to generate at least one forward error correcting bit string and generating at least one forward error correcting packet from the at least one forward error correcting bit string. Also disclosed is technique for recovering from losses of real time media packets including forming media bit strings from received media packets, forming forward error correcting bit strings from received forward error correcting packets, decoding the formed media bit strings and forward error correcting bit strings to obtain recovered media bit strings and recover lost media packets from the recovered media bit strings. Further described is a data structure for a forward error correcting header on computer readable media.

U.S. Pat. No. 10,063,261 discloses communication endpoints and related methods for forward error correction (FEC). A communication endpoint includes control circuitry including a packetizer configured to segment near-end data into groups of near-end data packets, and a forward error correction (FEC) packet generator configured to generate at least two near-end FEC packets for each group of near-end data packets. A method includes generating the FEC packets, and transmitting the data packets and the FEC packets to a far-end communication endpoint. A communication endpoint includes control circuitry including a forward error correction repairer configured to use far-end FEC packets to repair groups of far-end data packets. A method includes receiving a group of far-end data packets and corresponding far-end FEC packets, and repairing far-end data packets with the corresponding far-end FEC packets.

The references cited above teach background information that may be applicable to the presently disclosed subject matter. Therefore, the full contents of these publications are incorporated by reference herein where appropriate for appropriate teachings of additional or alternative details, features and/or technical background.

GENERAL DESCRIPTION

In accordance with certain aspects of the presently disclosed subject matter, there is provided a method of transmitting a streaming media with Forward Error Correction (FEC). The method comprises: upon receiving the streaming media, encoding, segmenting and packeting frames comprised therein to generate a packetized elementary stream of media packets with variable sizes; for each L sequential media packets, calculating a "random loss" (RL) FEC parity and generating a respective RL FEC packet associated therewith; calculating one or more "burst loss" (BL) FEC parities in accordance with a predefined FEC scheme and generating respective BL FEC structures bearing FEC headers and usable for generating BL FEC packets; calculating size-related parameters of a group of sequential media packets, the group being selected in accordance with the FEC scheme; and transmitting the packetized elementary stream with interleaved FEC packets, wherein the BL FEC packets are transmitted merely when the calculated size-related parameters meet a size-related burst loss (SRB) criterion defined by the FEC scheme. Optionally, BL FEC packets can be generated regardless of SRB criterion and discarded if the SRB criterion is not met.

The method can further comprise indexing the group of sequential media packets into a two-dimensional array comprising D rows and L columns, wherein RL FEC parities are calculated for each row of the array and BL FEC parities are calculated for each column of the array and/or at least part of diagonals of the array.

In accordance with other aspects of the presently disclosed subject matter, there is provided a transmitter to transmit a streaming media with Forward Error Correction (FEC). The transmitter comprises processing and memory circuitry (PMC) configured to: upon receiving the streaming media, encode, segment and packet frames comprised therein, thereby generating a packetized elementary stream of media packets with variable sizes; for each L sequential media packets, calculate a "random loss" (RL) FEC parity and generate a respective RL FEC packet associated therewith; calculate one or more "burst loss" (BL) FEC parities in accordance with a predefined FEC scheme and generate respective BL FEC structures bearing FEC headers and usable for generating BL FEC packets; calculate size-related parameters of a group of sequential media packets, the group being selected in accordance with the FEC scheme; and transmit the packetized elementary stream with interleaved FEC packets, wherein the BL FEC packets are transmitted merely when the calculated size-related parameters meet a size-related burst loss (SRB) criterion defined by the FEC scheme.

In accordance with further aspects and, optionally, in combination with other aspects of the presently disclosed subject matter, each given RL FEC packet can be transmitted as sequentially interleaved after L sequential media packets associated therewith. BL FEC packets can be interleaved after L*D media packets.

In accordance with further aspects and, optionally, in combination with other aspects of the presently disclosed subject matter, the FEC scheme can defines D and L values of the two-dimensional array and/or the value of SRB criterion in accordance with bit rate, GOP and/or video resolution parameters of one or more samples of the streaming media. Optionally, the one or more samples of the streaming media can be captured during transmission and D and L values and/or SRB criterion can be re-defined accordingly.

The inventor has recognized and appreciated that taking advantage of the variable size of the transmitted media packets and adapting the "burst loss" protection to the size of transmitting data can significantly reduce the bandwidth requirements and the latency of transmitting the media packets. Among advantages of certain embodiments of the presently disclosed subject matter is dynamical adaptation of FEC protection to the streaming media. The dynamical adaptation enables FEC protection with an optimized relationship between bandwidth requirements and likelihood of burst losses due to the anticipated length of burst packets.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "calculating", "transmitting", "generating", "receiving", "reconstructing" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, receivers, transmitters and processing circuitry therein disclosed in the present application.

The operations in accordance with the teachings herein may be performed by a computer specially constructed for the desired purposes or by a general-purpose computer specially configured for the desired purpose by a computer program stored in a non-transitory computer-readable storage medium.

Figure 1:
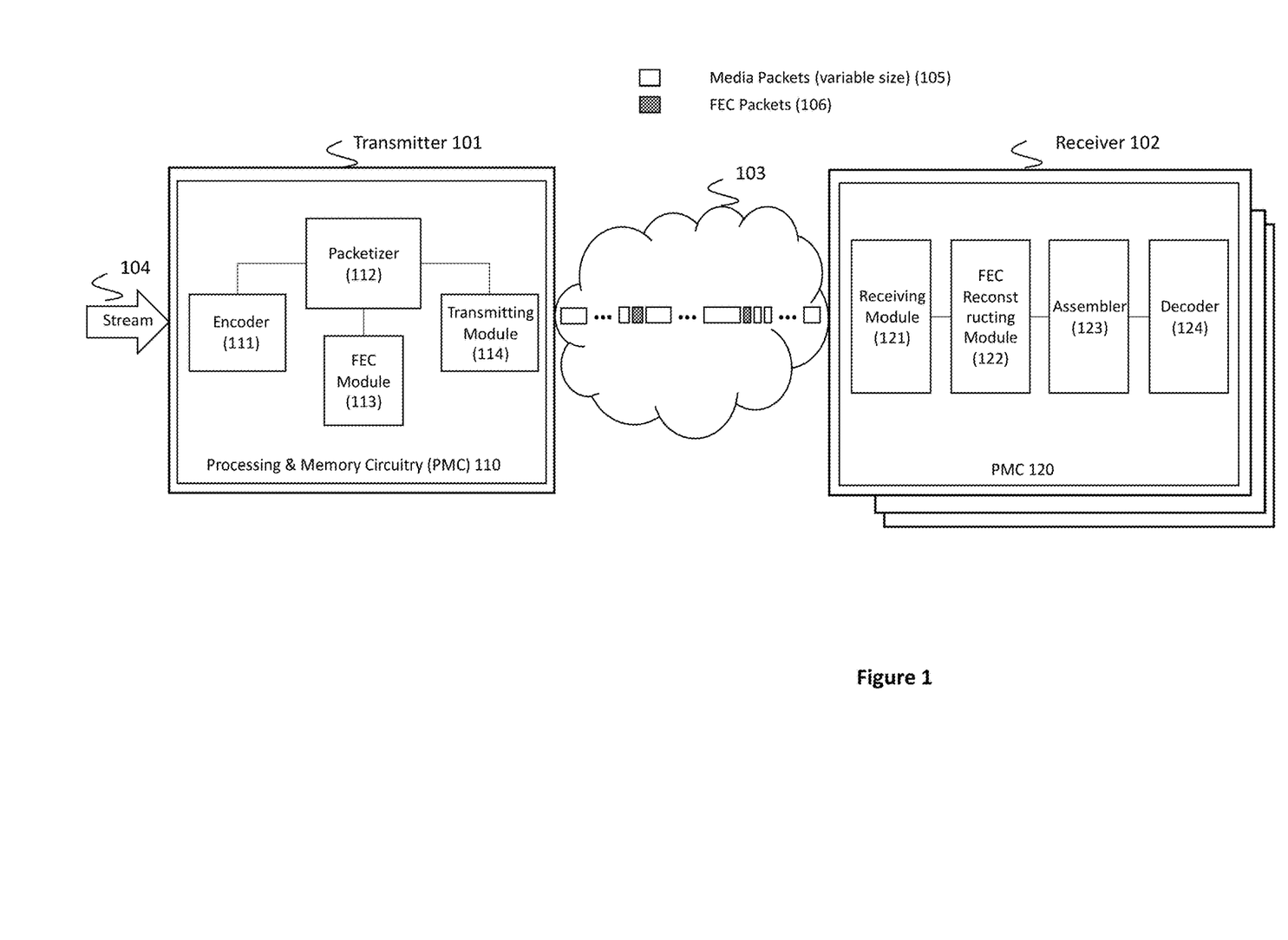
FIG. 1 illustrates a generalized block diagram of a communication system configured to provide streaming media transmission with forward error correction in accordance with certain embodiments of the presently disclosed subject matter.

Bearing this in mind, attention is drawn to FIG. 1 illustrating a generalized block diagram of a communication system configured to provide streaming media transmission with forward error correction in accordance with certain embodiments of the presently disclosed subject matter. The system includes transmitter 101 operatively connected to one or more receivers 102 over packet-switched communication network 103 (e.g. local/campus network, Internet, etc.). Transmitter 101 comprises processing & memory circuitry (PMC) 110 and receiver 101 comprises PMC 120.

Each PMC comprises one or more processors operatively connected to one or more memories (not shown separately within the processing circuitries). A processing circuitry can be configured to execute several program components in accordance with computer-readable instructions implemented on a non-transitory computer—readable storage medium. Such executable program components are referred to hereinafter as functional modules comprised in the processing circuitry and will be further detailed with reference to FIGS. 1-5. The functional modules can be implemented in any appropriate combination of software with firmware and/or hardware.

PMC 110 comprises encoder 111 operatively connected to packetizer 112 that is operatively connected to transmitting module 114. PMC 110 further comprises FEC module 113 operatively connected to packetizer 112.

Encoder 111 is configured to receive media stream 104 and to compress the received data using compression protocols known in the art (e.g., H.263, H.264, H.265, etc.). A compression protocol can generate different types of frames. By way of non-limiting example, a compression protocol (e.g. H.265) generates 3 types of frames: I-frames informative of a complete image, P-frame (delta-frames) informative only of the changes in the image from the previous frame, and B-frame informative of differences between the current frame and both the preceding and following frames to specify its content. When a size of a frame exceeds a predefined maximal size (e.g. corresponding to a maximal size of a transmittable packet), the encoder further segments the frames into segments fitting this maximal size. Thus, after segmenting, the size of some of the segments will be equal to the maximal size configured for encoder 111, while another segments (the last in the segmented frames) and non-segmented frames (mostly P-frames and B-frames) can be less (or even much less) than said maximal size. Non-limiting examples of samples of H.625 stream are further detailed with reference to FIGS. 5a-5c.

The frame segments and the unsegmented frames are transferred to packetizer 112. The packetizer is configured to packetize each encoded unsegmented frame and/or segment into media packet. In accordance with certain embodiments of the presently disclosed subject matter, packeting includes generating data packet headers for each of the media data packets, whilst keeping the size of a packet payload equal to the actual size of a respective frame/segment. Thus, packetizer 112 generates a packetized elementary stream. By way of non-limiting example, the headers of the generated media data packet (referred to hereinafter also as media packets) can be specified by a real-time transport protocol (RTP) specified in RFC1889.

For purpose of illustration only, the following description is provided for H.625 stream transmitted in accordance with RTP protocol. Those skilled in the art will readily appreciate that the teachings of the presently disclosed subject matter are, likewise, applicable any other protocols suitable for transmission of streaming media.

FEC module 113 is configured to enable generation of FEC packets usable for reconstruction of media packets lost during transmission. Some FEC packets can be devoted to reconstruction of randomly lost packets (such FEC packets are referred to hereinafter as "random loss" or RL FEC packets) and another FEC packets can be devoted to reconstruction of packets losses due to the bursts (such FEC packets are referred to hereinafter as "burst loss" or BL FEC packets).

FEC module 113 is configured to operate in accordance with a predefined FEC scheme specifying the rules of generating and sending RL FEC packets and BL FEC packets. The FEC scheme can be stored in PMC 110 or another place (within or out of transmitter 101) operatively connected to PMC 110.

Figure 2:
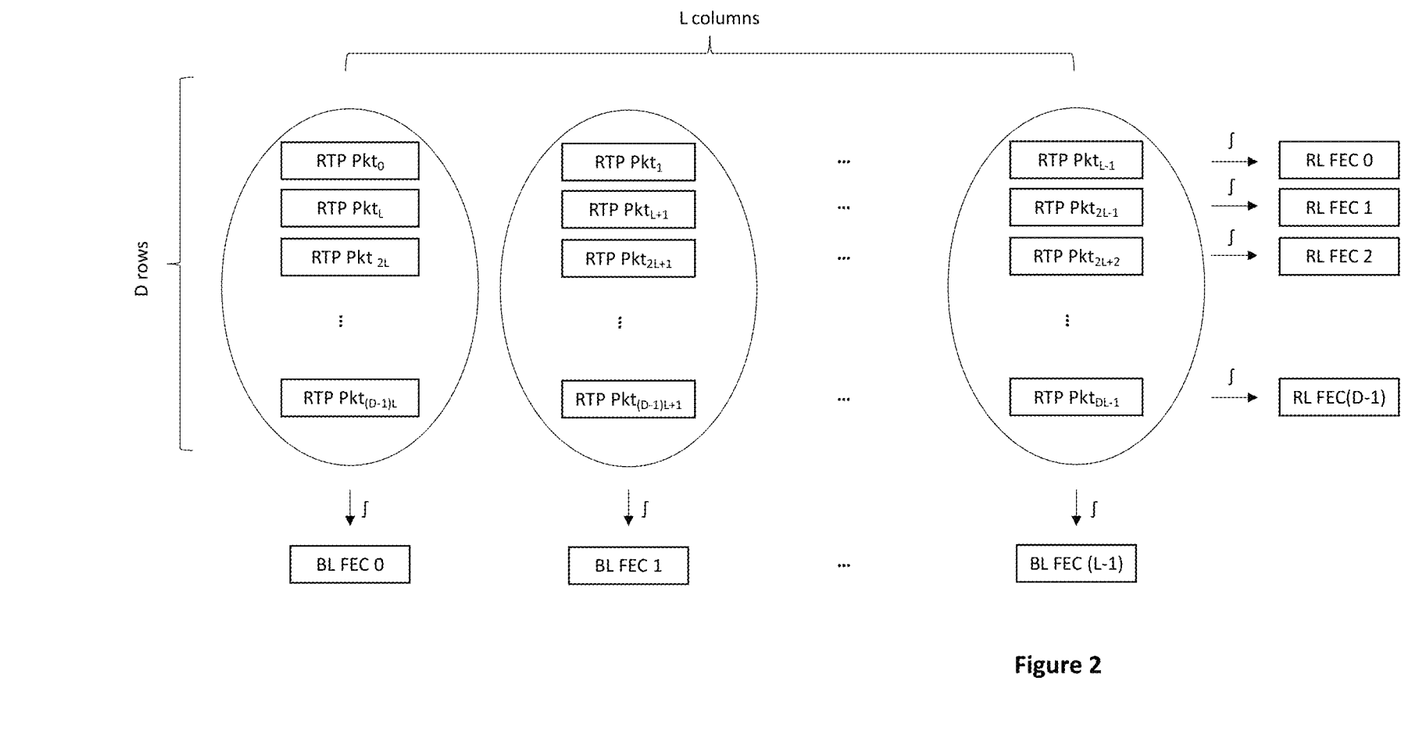
FIG. 2 illustrates a generalized scheme of a two-dimensional array of media packets, the array usable for generating FEC packets.

FEC module 113 can be configured to index a group of sequential media packets into a two-dimensional array as illustrated in FIG. 2. The illustrated array comprises D rows and L columns. FEC module 113 calculates parities (denoted as RL FEC0–RL FEC(D–1)) for each row in the matrix, these parities are usable for generating RL FEC packets, one RL FEC packet per row. FEC module 113 further calculates parities (denoted as BL FEC0–BL FEC(L–1)) for each column in the matrix, these parities are usable for generating BL FEC packets to handle burst losses up to length L, one BL FEC packet per column. Alternatively or additionally, parities for BL FEC packets can be calculated for array's diagonals, or otherwise in accordance with applied FEC burst protection techniques. By way of non-limiting example, each parity can be calculated as an exclusive or (XOR) of the packets in the row, column or diagonal for which the parity is being calculated. The numbers D and L and the rules of parities' calculating are specified by the FEC scheme.

In accordance with certain embodiments of the presently disclosed subject matter, the rules defined by FEC scheme can specify configuring FEC module 113 (including D and L numbers) depending on the bit rate, GOP and/or video resolution of the stream to be transmitted.

Figure 5A:
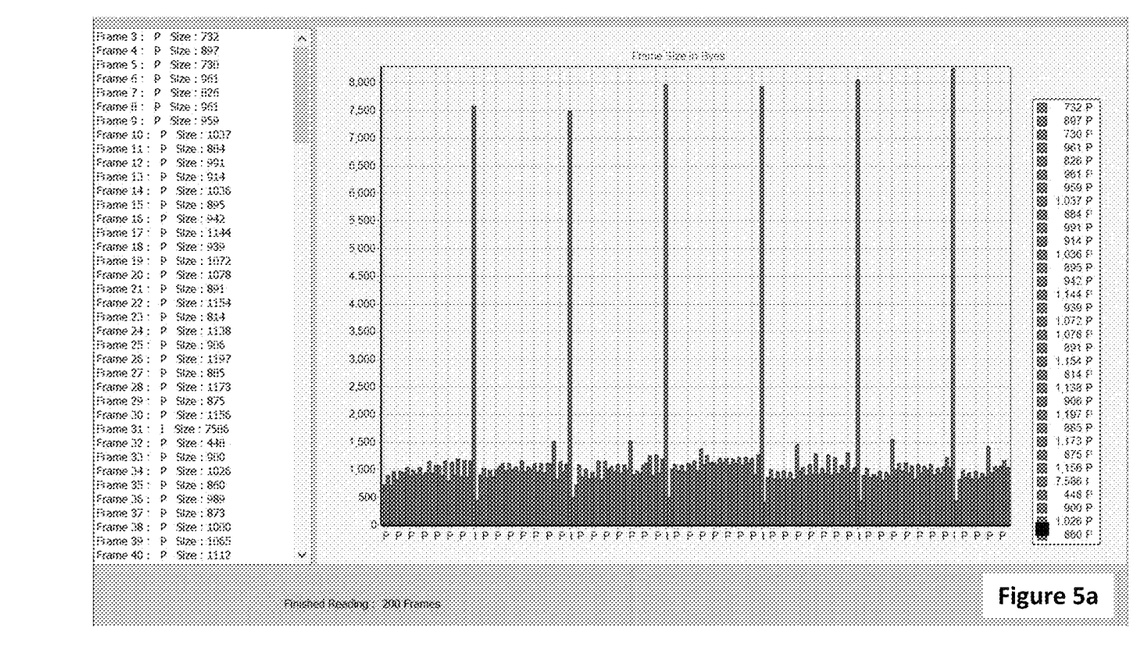
FIGS. 5a-5c illustrate non-limiting examples of samples of H.625 stream as captured by a stream analyzer.
Figure 5B:
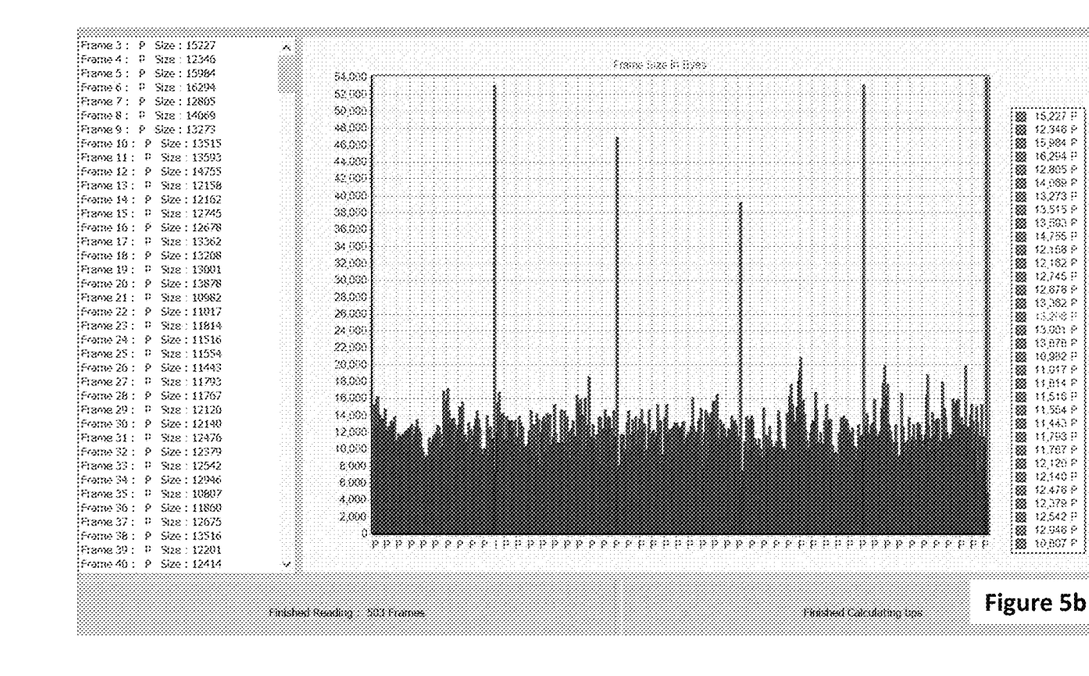
Figure 5C:
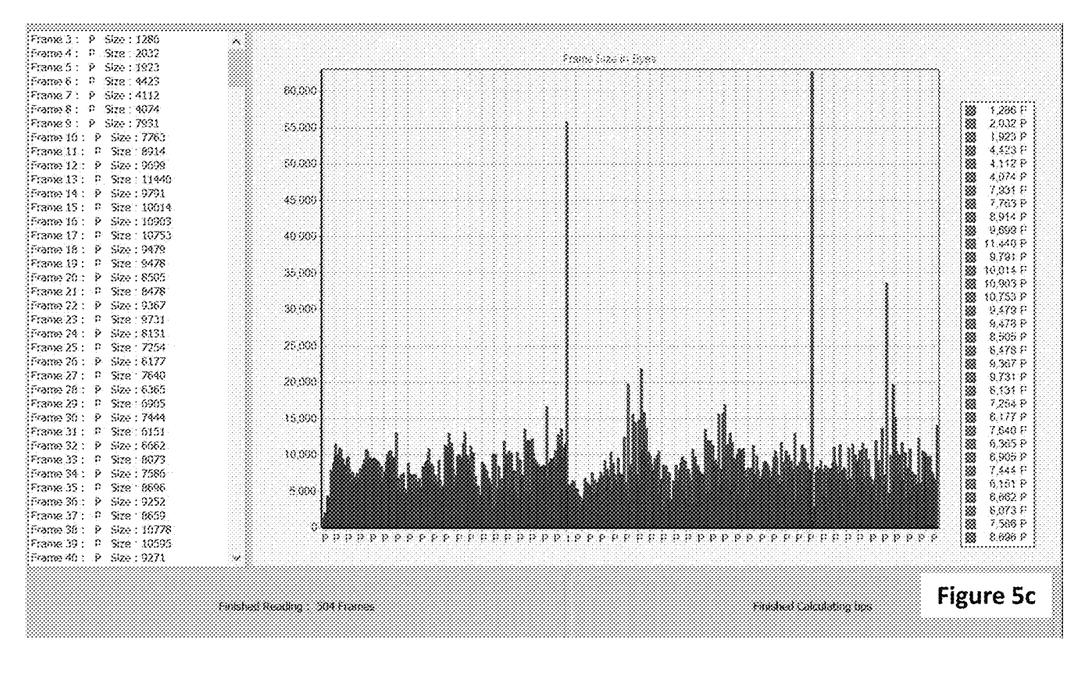

Optionally, FEC scheme can specify the rules of configuring FEC module 113 in accordance with characteristics of a sample of a respective stream. Non-limiting examples of the samples are illustrated in FIGS. 5a-5c. A stream sample can be captured prior to the transmission. Optionally, the samples can be also captured during the transmission (periodically or continuously), and FEC module 113 can be accordingly reconfigured on-the-fly, if required so. Optionally, D and L numbers can be further dynamically adapted in accordance with the changes of characteristics of the communication links.

It is noted that the teachings of the presently disclosed subject matter are not bound by calculating RL FEC and BL FEC parities as detailed above. The teachings are, likewise, applicable to other FEC coding schemes enabling separate parities related to the random losses and to the burst losses.

FEC module 113 is further configured to add a FEC header to each calculated parity thereby generating a respective FEC structure, and to move the generated FEC structures to paketizer 112 for RTP encapsulating and generating respective FEC packets.

Figure 3A:
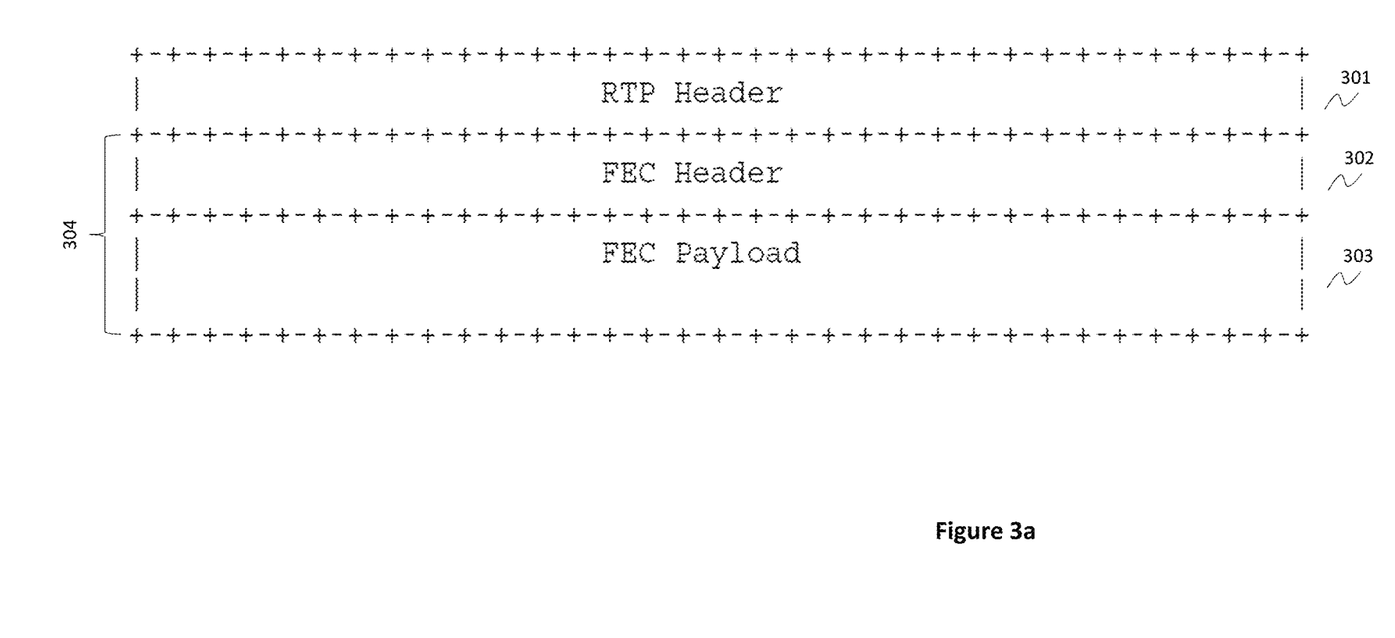
FIG. 3a illustrates a generalized format of a FEC packet.

Generalized format of a FEC packet is illustrated in FIG. 3a. A FEC packet comprises RTP header 301 and FEC structure configured as RTP payload 304. FEC structure comprises FEC header 302 and FEC payload (calculated parity) 303.

Thus, the headers of the media data packet and FEC packets can be specified in accordance with a real-time transport protocol (RTP). Among other information, an RTP header comprises data indicative of a payload type allowing to differentiate media from FEC payload and a sequence number usable to define a position of a lost packet within the sequential packets.

Figure 3B:
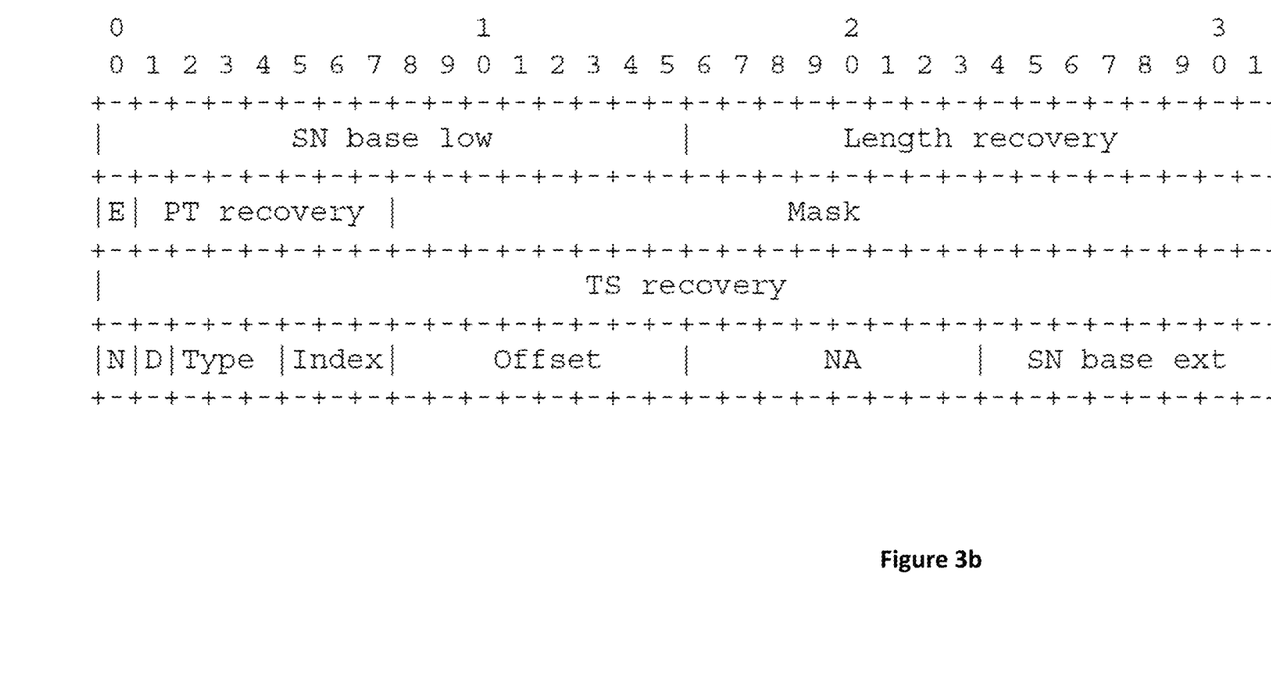
FIG. 3b illustrates a generalized FEC header.

The generalized diagram of a FEC header is illustrated in FIG. 3b. Among other information, FEC header is informative of FEC type, FEC block size, the number of media packets associated with the FEC structure, the minimum sequence number of the media packets associated to the FEC structure, the period used to select the media packets associated with this FEC structure, the FEC structure index, an indication of column FEC stream and row FEC stream. The FEC header also includes the fields of length recovery, payload type recovery and timestamp recovery.

Referring back to FIG. 1, as detailed above, FEC module 113 is configured to operate in accordance with a predefined FEC scheme specifying the rules of generating and sending RL FEC packets and BL FEC packets. In accordance with certain embodiments of the presently disclosed subject matter and as will be further detailed with reference to FIGS. 4-5, FEC scheme can further specify a size-related burst loss (SRB) criterion for providing a "burst loss" FEC protection for a group of sequential packets selected in accordance with the FEC scheme. The group of sequential packets selectable in accordance with the FEC scheme for "burst loss" FEC protection is referred to hereinafter as BL group. FEC module 113 can be further configured to define when a size of a BL group of sequential packets meets SRB criterion and to enable generating and sending BL FEC packets only when the size meets SRB criterion.

In certain embodiments, FEC module 113 can be configured to send BL FEC structures to packetizer 112 only when SRB criterion is met. Alternatively, FEC module 113 can be configured to send to packetizer 112 all generated BL FEC structures and, merely when SRB criterion is met, to instruct packetizer 112 to send BL FEC packets.

Packetizer 112 is operatively connected to transmitting module 114. Transmitting module 114 is configured to encapsulate the media packets and FEC packets as necessary for transmitting the packets over the packet-switched communication network 103, and to transmit the encapsulated packets. By way of non-limiting example, the encapsulation can be provided into RTP/UDP/IP protocol stack.

The FEC scheme can specify that FEC packets 106 shall be transmitted as interleaved into the sequence of media packets 105. By way of non-limiting example, FEC scheme can specify that each row of media packets shall be followed by a corresponding RL FEC packet, and BL FEC packets (if any) shall be sent after the last media packet in the array.

Alternatively, FEC scheme can specify that media packets 105 and FEC packets 106 shall be transferred as separate streams to different ports at receiver 102. Optionally, RL FEC packets and BL FEC packets can be transferred as separate streams. Sequencing the packets in the transmitted stream(s) in accordance with the FEC scheme can be enabled by packetizer 112 and/or transmitting module 114.

Referring to the receiving side, PMC 120 comprises receiving module 121, FEC reconstructing module 122, assembler 123 and decoder 124. Receiving module 121 can be configured to detect packets losses and FEC reconstructing module 122 can be configured to reconstruct the lost packets using the received FEC packets. Assembler 123 can be configured to de-packetize the packets and to assemble the received and reconstructed media packets into compressed data. Assembling can include padding when necessary (e.g. unsegmented frames, last segments of the frames) to the equal size specified for the decoder. Decoder 124 is configured to receive and decompress the assembled compressed data.

It is noted that the teachings of the presently disclosed subject matter are not bound by the architecture of the transmitter and the receiver described with reference to FIG. 1. Equivalent and/or modified functionality can be consolidated or divided in another manner and can be implemented in any appropriate combination of software with firmware and/or hardware and executed on a suitable device.

Figure 4:
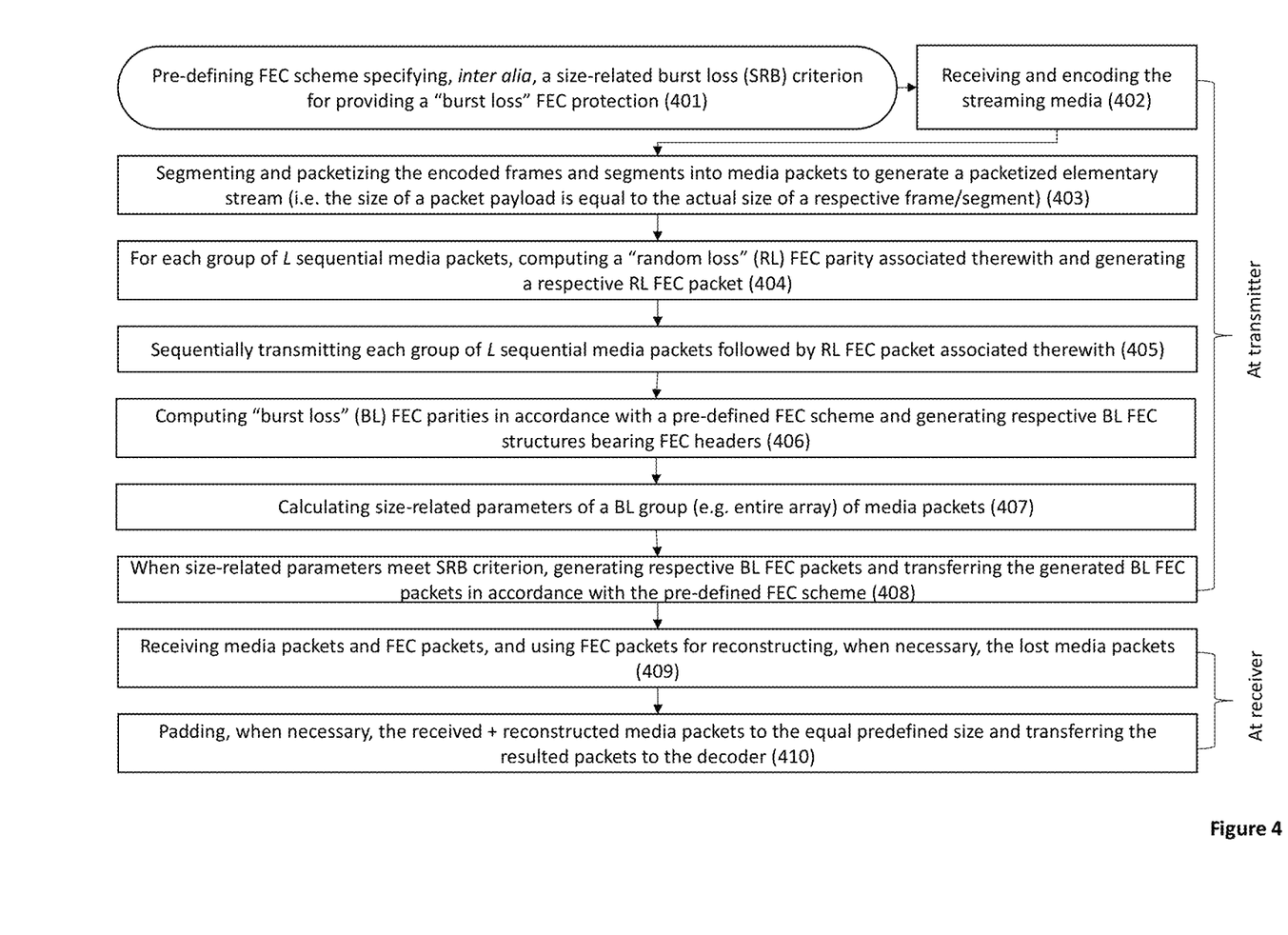
FIG. 4 illustrates a generalized flow-chart of streaming media communication with forward error correction in accordance with certain embodiments of the presently disclosed subject matter.

Referring to FIG. 4, there is illustrated a generalized flow chart of streaming media communication with forward error correction in accordance with certain embodiments of the presently disclosed subject matter.

FEC-based communication includes predefining (401) FEC scheme that specifies the rules of generating and sending RL FEC packets and BL FEC packets. In accordance with certain embodiments of the presently disclosed subject matter FEC scheme further specifies a size-related burst loss (SRB) criterion for providing a "burst loss" FEC protection.

Receiving and encoding (402) a streaming media at a transmitter side is followed by segmenting and packeting the frames to generate (403) a packetized elementary stream of media packets. The size of the payloads of media packet varies, for example the size of the packets corresponding to the last segments of the segmented frames and/or to the un-segmented frames (e.g. P-frames or B-frames) can be significantly less than the maximal size of the media packets.

Obviously, adding FEC packets to the media packets increases the amount of data to be transmitted, and thus the required transmission bandwidth and the transmission time. The inventor has recognized and appreciated that taking advantage of the variable size of the transmitted media packets and adapting the "burst loss" protection to the size of transmitting data can significantly reduce the bandwidth requirements and the latency of transmitting the media packets.

For each group of L sequential media packets, transmitter 101 calculates (404) a "random loss" (RL) FEC parity associated therewith and generates a respective RL FEC packet. Transmitter 101 transmits (405) the packetized elementary stream, wherein each group of L sequential media packets is followed (in the same or in a separate stream) by RL FEC packet.

Transmitter 101 further calculates (406) "burst loss" (BL) FEC parities in accordance with the predefined FEC scheme and generates respective BL FEC structures bearing FEC headers. By way of non-limiting example, BL FEC parities can be calculated for each column of the L*D array of media packets.

Transmitter 101 calculates (407) size-related parameters of a BL group of sequential media packets, while said BL group is selected in accordance with the FEC scheme. When size-related parameters meet size-related burst loss (SRB) criterion, transmitter 101 generates respective BL FEC packets and transfers (408) the generated BL FEC packets in accordance with the predefined FEC scheme. Optionally, transmitter 101 can generate BL FEC packets regardless of SRB criterion, however, transmitter 101 does not sent (discards) BL FEC packets when the SRB criterion is not met.

By way of non-limiting, BL group can be defined as L*D array, and SRB criterion can be specified as a minimal size of the entire L*D array, this size of sequential packets can be defined by the FEC scheme as requiring BL FEC protection. The SRB criterion can be met when the total size of at least a part of sequential media packets in the array exceeds this minimal size, and when so—BL FEC packets corresponding to all columns of the array can be sent to the receiver.

By way of another non-limiting example, BL group can be defined as a row and SRB criterion can be specified as a minimal quantity (and/or minimal percentage) of large (e.g. up to 80% of maximal frame size) media packets in a row, and the SRB criterion can be met when the quantity (and/or percentage) exceeds this parameter(s). In such a case, BL FEC packets corresponding to all columns of the array can be sent to the receiver.

Alternatively or additionally, in certain embodiments FEC scheme can define the value of SRB criterion as a function of bit rate, GOP and/or video resolution of the stream. Optionally, the function can be implemented as a look-up table with predefined corresponding SRB values. In addition, the FEC scheme can specify the rules of defining the value of SRB criterion in a dynamic manner, (e.g. as a function of available bandwidth, type of media, SLA of transmission, etc.).

Following are non-limiting examples of configuring the array of sequential RTP packets and SRB value for the different streams. FIGS. 5a-5c illustrate samples of H.625 stream captured by a stream analyser. The illustrated streams comprise I-frames and P-frames. Parameters of the streams are summarized in Table 1.

TABLE 1

Parameters of the stream samples illustrated in FIGS. 5a-5c.

|  | FIG. 5a | FIG. 5b | FIG. 5c |
|---|---|---|---|
| Video resolution, pixels | 640 × 480 | 1280 × 720 | 1920 × 1080 |

TABLE 1-continued

Parameters of the stream samples illustrated in FIGS. 5a-5c.

|  | FIG. 5a | FIG. 5b | FIG. 5c |
|---|---|---|---|
| Bit rate, kbps | 500 | 3000 | 2000 |
| GOP | 30 | 100 | 200 |
| Maximal RTP packet size, bytes | 1250 | 1250 | 1250 |

Referring to the stream samples illustrated in FIGS. 5a-5c, Table 2 summarizes the examples of correspondingly defined L and D values in L*D arrays, the minimal sizes (bytes) of the entire L*D arrays requiring BL FEC protection (SRB criterion values) and traffic overhead due to RL FEC and BL FEC packets.

TABLE 2

Exemplified L*D arrays, values of SRB criterion and FEC overhead for the stream samples illustrated in FIGS. 5a-5c.

|  | FIG. 5a | FIG. 5b | FIG. 5c |
|---|---|---|---|
| L*D | 4*4 | 5*6 | 5*8 |
| Overhead due to, merely, RL FEC packets | 25% | 16% | 12% |
| Overhead due to BL FEC and RL FEC packets (if FEC scheme were applied to all media packets) | 50% | 36% | 32% |
| SRB criterion (min. size of the entire array configured as requiring BL protection), bytes | 17,500 | 37,500 | 50,000 |

In view of the parameters of the stream illustrated in FIG. 5a, the size of array is defined as 4*4. As illustrated, a size of a large frame is at least 7,500 bytes, i.e. corresponds to at least 6 sequential RTP media packets, each of 1250 bytes. The average size of the rest of the frames is about 1000 bytes. The value of SRB criterion can be calculated as SRB=6*1250+10*1000=17,500 bytes. Accordingly, for the exemplified stream parameters, the sequence of 6 media packets is considered as being long, and the arrays with the total size of media packets exceeding 17,500 bytes will be protected by RL FEC packets and BL FEC packets. The other arrays will be protected merely by RL FEC packets.

In view of the parameters of the stream illustrated in FIG. 5b, the size of array is defined as 5*6. As illustrated, a size of a large frame is at least 38,000 bytes, i.e. corresponds to a burst of at least 30 sequential media packets of 1,250 bytes (considered as being long bursts). The size of most of the rest frames is between 8,000 and 12,000, i.e. corresponds to a burst of less than 10 sequential media packets of 1,250 bytes (considered as being a short burst) followed by a media packet being a remain of the frame segmentation (mostly, with the size less than 1,250 bytes). The value of SRB criterion can be defined as SRB=30*1250=37,500 bytes. Accordingly, in this example, the arrays with bursts considered (in view of the stream parameters) as being long will be protected by RL FEC packets and BL FEC packets, while most of the other arrays will be protected merely by RL FEC packets.

Referring to FIG. 5c, the size of array corresponding to the stream parameters is defined as 5*8. As illustrated, a size of a large frame is at least 35,000 bytes, i.e. corresponds to a long burst of at least 44 sequential media packets of 1,250 bytes. The sizes of most of the rest frames is between 8,000 and 12,000, i.e. corresponds to a short burst of less than 10 sequential media packets of 1,250 bytes followed by a short media packet (the remain of the respective frame segmentation). The value of SRB criterion can be defined as SRB=40*1250=50,000 bytes. Accordingly, likewise in the example of FIG. 5b, the arrays with long bursts of media packets will be protected by RL FEC packets and BL FEC packets, while most of the other arrays will be protected merely by RL FEC packets.

Thus, adapting the "burst loss" protection to the size of transmitting data can significantly reduce the overhead caused by BL FEC packets.

Referring back to FIG. 4, receiver 102 receives the packetized elementary stream of media packets and FEC packets and uses (409) FEC packets for reconstructing, when necessary, the lost media packets in any suitable way known in the art. When necessary, receiver 102 pads (410) the received and/or reconstructed media packets to the equal predefined size to be used by a respective media player.

It is noted that the teachings of the presently disclosed subject matter are not bound by the flow chart illustrated in FIG. 4, the illustrated operations can occur out of the illustrated order. For example, operations 404 and 407 shown in succession can be executed substantially concurrently.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined in and by the appended claims.

The invention claimed is:

1. A method of transmitting a streaming media with Forward Error Correction (FEC), the method comprising:
   upon receiving the streaming media, encoding, segmenting and packeting frames comprised therein to generate a packetized elementary stream of media packets with variable sizes;
   for each L sequential media packets, calculating a "random loss" (RL) FEC parity and generating a respective RL FEC packet associated therewith;
   calculating one or more "burst loss" (BL) FEC parities in accordance with a predefined FEC scheme and generating respective BL FEC structures bearing FEC headers and usable for generating BL FEC packets;
   calculating size-related parameters of a group of sequential media packets, the group being selected in accordance with the FEC scheme; and
   transmitting the packetized elementary stream with interleaved FEC packets, wherein the BL FEC packets are transmitted merely when the calculated size-related parameters meet a size-related burst loss (SRB) criterion defined by the FEC scheme.

2. The method of claim 1, wherein each given RL FEC packet is transmitted as sequentially interleaved after L sequential media packets associated therewith.

3. The method of claim 1, further comprising indexing the group of sequential media packets into a two-dimensional array comprising D rows and L columns, wherein RL FEC parities are calculated for each row of the array and BL FEC parities are calculated for each column of the array and/or at least part of diagonals of the array.

4. The method of claim 3, wherein the BL FEC packets are interleaved after L*D media packets.

5. The method of claim 3, wherein D and L values of the two-dimensional array are defined by the FEC scheme in accordance with bit rate, GOP and/or video resolution parameters of the stream.

6. The method of claim 1, wherein the FEC scheme defines the value of SRB criterion in accordance with bit rate, GOP and/or video resolution parameters of one or more samples of the streaming media.

7. The method of claim 6, further comprising capturing, during the transmission, the one or more samples of the streaming media and re-defining the value of SRB criterion accordingly.

8. The method of claim 1, further comprising generating the BL FEC packets regardless of SRB criterion; and discarding the generated BL FEC packets when the SRB criterion is not met.

9. The method of claim 1, wherein the SRB criterion is specified as a minimal size of the group of sequential media packets, and SRB criterion is met when the total size of at least a part of sequential media packets in the group exceeds the minimal size.

10. A transmitter to transmit a streaming media with Forward Error Correction (FEC), the transmitter comprising processing and memory circuitry (PMC) configured to:
  upon receiving the streaming media, encode, segment and packet frames comprised therein, thereby generating a packetized elementary stream of media packets with variable sizes;
  for each L sequential media packets, calculate a "random loss" (RL) FEC parity and generate a respective RL FEC packet associated therewith;
  calculate one or more "burst loss" (BL) FEC parities in accordance with a predefined FEC scheme and generate respective BL FEC structures bearing FEC headers and usable for generating BL FEC packets;
  calculate size-related parameters of a group of sequential media packets, the group being selected in accordance with the FEC scheme; and
  transmit the packetized elementary stream with interleaved FEC packets, wherein the BL FEC packets are transmitted merely when the calculated size-related parameters meet a size-related burst loss (SRB) criterion defined by the FEC scheme.

11. The transmitter of claim 10, wherein the PMC is configured to transmit each given RL FEC packet as sequentially interleaved after L sequential media packets associated therewith.

12. The transmitter of claim 10, wherein the PMC is further configured to index the group of sequential media packets into a two-dimensional array comprising D rows and L columns, wherein RL FEC parities are calculated for each row of the array and BL FEC parities are calculated for each column of the array and/or at least part of diagonals of the array.

13. The transmitter of claim 12, wherein the BL FEC packets are interleaved after L*D media packets.

14. The transmitter of claim 12, wherein D and L values of the two-dimensional array are defined by the FEC scheme in accordance with bit rate, GOP and/or video resolution parameters of the stream.

15. The transmitter of claim 10, wherein the FEC scheme defines the value of SRB criterion in accordance with bit rate, GOP and/or video resolution parameters of one or more samples of the streaming media.

16. The transmitter of claim 15, further configured to obtain, during the transmission, the one or more samples of the streaming media and re-define the value of SRB criterion accordingly.

17. The transmitter of claim 10, further configured to generate the BL FEC packets regardless of SRB criterion and to discard the generated BL FEC packets when the SRB criterion is not met.

18. The transmitter of claim 10, wherein the SRB criterion is specified as a minimal size of the group of sequential media packets, and SRB criterion is met when the total size of at least a part of sequential media packets in the group exceeds the minimal size.

19. A non-transitory computer readable medium usable by transmitter to transmit a streaming media with Forward Error Correction (FEC), the computer readable medium comprising instructions that, when executed by a processor and memory circuitry (PMC) comprised in the transmitter, cause the PMC to perform operations comprising:
  upon receiving the streaming media, encoding, segmenting and packeting frames comprised therein to generate a packetized elementary stream of media packets with variable sizes;
  for each L sequential media packets, calculating a "random loss" (RL) FEC parity and generating a respective RL FEC packet associated therewith;
  calculating one or more "burst loss" (BL) FEC parities in accordance with a predefined FEC scheme and generating respective BL FEC structures bearing FEC headers and usable for generating BL FEC packets;
  calculating size-related parameters of a group of sequential media packets, the group being selected in accordance with the FEC scheme; and
  transmitting the packetized elementary stream with interleaved FEC packets, wherein the BL FEC packets are transmitted merely when the calculated size-related parameters meet a size-related burst loss (SRB) criterion defined by the FEC scheme.

* * * * *